(12) United States Patent
Cohn et al.

(10) Patent No.: US 7,188,322 B2
(45) Date of Patent: Mar. 6, 2007

(54) CIRCUIT LAYOUT METHODOLOGY USING A SHAPE PROCESSING APPLICATION

(75) Inventors: John M. Cohn, Richmond, VT (US); Jason Hibbeler, Williston, VT (US); Anthony K. Stamper, Williston, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 10/906,591

(22) Filed: Feb. 25, 2005

(65) Prior Publication Data

US 2006/0195809 A1    Aug. 31, 2006

(51) Int. Cl.
*G06F 17/50* (2006.01)

(52) U.S. Cl. .............................. 716/2; 716/19; 716/20; 716/21

(58) Field of Classification Search .................... 716/2, 716/11, 19–21
See application file for complete search history.

(56) References Cited

U.S. PATENT DOCUMENTS

| 4,615,011 | A | 9/1986 | Linsker | |
|---|---|---|---|---|
| 5,381,343 | A | 1/1995 | Bamji et al. | 716/2 |
| 5,475,804 | A | 12/1995 | Bennett | 345/668 |
| 5,477,467 | A | 12/1995 | Rugg | 716/17 |
| 5,583,788 | A | 12/1996 | Kuribayashi | |
| 5,729,469 | A | 3/1998 | Kawakami | |
| 5,936,868 | A | 8/1999 | Hall | |
| 2005/0118514 | A1* | 6/2005 | Tsai | 430/5 |

FOREIGN PATENT DOCUMENTS

| JP | 1-147841 | 9/1989 |
|---|---|---|
| JP | 11-312185 | 9/1999 |

OTHER PUBLICATIONS

Abstract of German Patent No. 3242547A1 dated May 24, 1984, issued to Schwerin; and.
Abstract of Japanese Patent No. 62104074A dated May 14, 1987, issued to Takashi et al.

* cited by examiner

*Primary Examiner*—Thuan Do
(74) *Attorney, Agent, or Firm*—Scully, Scott, Murphy & Presser, P.C.; Richard M. Kotulak, Esq.

(57) ABSTRACT

A circuit layout methology is provided for eliminating the extra processing time and file-space requirements associated with the optical proximity correction (OPC) of a VLSI design. The methodology starts with the design rules for a given manufacturing technology and establishes a new set of layer-specific grid values. A layout obeying these new grid requirements leads to a significant reduction in data preparation time, cost, and file size. A layout-migration tool can be used to modify an existing layout in order to enforce the new grid requirements.

16 Claims, 3 Drawing Sheets

(1)

(2)

(3)

(4)

(5)

CIRCUIT LAYOUT METHODOLOGY USING A SHAPE PROCESSING APPLICATION

BACKGROUND OF THE INVENTION

1. Field of the Invention

The present invention relates generally to a circuit layout methodology for an integrated circuit (IC), and more particularly pertains to a circuit layout methodology for developing a layout for a very large scale integrated circuit (VLSI) with a set of reduced layout grid ground rules. The circuit layout methodology starts with the design rules for a given technology for fabricating an IC, and establishes a new set of layer-specific layout grid values. A circuit layout obeying these new layout grid requirements leads to a significant reduction in data preparation time, cost, and file size. The present invention can be used for migrating an existing VLSI layout to a set of reduced layout grid ground rules. A layout-migration tool can be used to modify an existing IC layout in order to enforce the new layout grid requirements. A layout-optimization application can be used to rescale data, thus changing the layout grid size, and also adjusting the minimum line widths and minimum line spaces, and a shapes-processing application can be used to adjust via sizes, locations and borders.

2. Discussion of the Prior Art

For any given technology for fabricating an IC on a wafer, (e.g. Intel Pentium™ microprocessor), a layout grid is defined for that technology. The layout grid represents the smallest dimensions that can be used by designers in layout data for each level in that technology. For a 130 nanometer (nm) generation technology, that value is approximately 0.01 microns. For wires and vias, this means that their widths and spacing are changed in 0.01 micron increments (e.g. 0.99, 1.00, 1.01 microns).

In addition, each technology for fabricating an IC specifies ground-rule values for minimum line width and minimum line spacing for each metal layer (M1 (the first and lowest metal layer), M2 (the second, next higher metal layer) and for each via layer (V1 (the via layer connecting M1 to M2), V2 (the via layer connecting M2 to M3)), etc. For a 130 nanometer (nm) generation technology, these ground-rule values are:

M1 minimum line width and line space=0.16 microns,
M2 minimum line width and line space=0.20 microns,
M3 minimum line width and line space=0.20 microns,
V1 minimum line width and line space=0.20 microns,
V2 minimum line width and line space=0.20 microns, etc.

For a 65 nm generation CMOS technology, the above values for a 130 nm generation CMOS technology are reduced by approximately one half.

It is apparent that the permitted feature sizes for wiring shapes are much smaller than the sizes actually required to draw wires in a VLSI layout, since for the exemplary 130 nm generation CMOS technology, the grid size is 0.01 microns and the M2 minimum line width and line space is 0.20 microns. The resolution enabled by the manufacturing layout grid size is in some sense unneeded for wiring levels, since the minimum line space and minimum line width ground rules for wires are large multiples of this fine grid size. The grid size is much smaller than the minimum feature size to allow for the use of optical proximity correction (OPC).

The end result of using OPC is that data volume and processing runtime increase unduly during data prep. This ultra-fine grid is necessary for the mask layers that require extensive OPC (such as the layers involved in forming devices) to account for photolithographic and etch problems, but such extensive OPC processing and ultra-fine grids are not normally necessary for the wiring layers.

SUMMARY OF THE INVENTION

The present invention relates generally to a circuit layout methodology for an integrated circuit (IC), and more particularly pertains to a circuit layout methodology for developing a layout for a very large scale integrated circuit (VLSI) with a set of reduced layout grid ground rules. The circuit layout methodology starts with the design rules for a given technology for fabricating an IC, and establishes a new set of layer-specific layout grid values.

The present invention provides a technique for eliminating the extra processing time and file-space requirements associated with the OPC of a VLSI design, and can use a layout grid size that is equal to or not much smaller than the dimensions of minimum size feature. A methodology is described that starts with the design rules for a given manufacturing technology and establishes a new set of layer-specific layout grid values. A circuit layout obeying these new grid requirements leads to a significant reduction in data preparation time, cost, and file size. Furthermore, a layout-migration tool can be used to modify an existing layout in order to enforce the new layout grid requirements. The penalty associated with these new grid requirements is that the chip size may increase because of the increased wire width and spacing.

The method proceeds as follows, for a given set of IC manufacturing ground rule values.

For the most critical layers such as PC (gate polysilicon conductor layer), RX (active silicon conductor layer that is surrounded by shallow trench isolation (STI) or field oxide) and M1 (first metal layer), a fine layout grid is required for accuracy in OPC. Use a fine layout grid for these layers, but ensure that interfaces to the layers above and below obey the layout grid constraints for the layers above and the layers below (e.g. PC-C1 (contact layer)-M1 or M1-V1-M2).

For each metal layer M2, M3, etc. in the IC technology, specify a new layout grid value Mx_grid equal to an integral fraction of the minimum line space and line width (Mx_space) ground rules for that layer. For example, the Mx_grid can be chosen to be ¼, ⅓, ½, etc. of Mx_space. All coordinates for Mx shapes in the circuit design must then be multiples of Mx_grid.

For via layer V1 (first via layer), do not use an ultra-fine layout grid, use a layout grid that is a fraction (e.g. ¼, ⅓, ½, etc. of the M2_grid value.

For via layers V2 (second via layer), V3 (third via layer), etc., use the corresponding layout grid of the metal layer below. For example, use metal layer M2_grid for via layer V2; metal layer M3_grid for via layer V3, etc.

For C1 (contact layer between PC and M1) and V1, do not use an ultra-fine layout grid. Use a layout grid that is a fraction (e.g. ¼, ⅓, ½) of the M2_grid value.

These steps permit a set of ground rules for any IC fabricating technology to be used to create a new "OPC-efficient" set of rules for the same technology. And for a given layout in the existing ground rules for the technology, use hierarchical layout optimization techniques of a layout-migration tool to enforce the new set of rules.

The present invention greatly simplifies design/layout rules, and has the potential to significantly decrease data volume and mask designs with less complex OPC.

BRIEF DESCRIPTION OF THE DRAWINGS

The foregoing objects and advantages of the present invention for a circuit layout methodology may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

For virtually all non-block mask layers/levels, i.e. wiring, vias, RX, PC, etc., layout grid sizes that are approximately ¹/₂₀th of a ground rule are commonly used to allow the use of optical proximity correction (OPC). For a 90 nm generation CMOS technology, the minimum ground rule is about 100 nm, and accordingly a layout grid size of 5 nm is used. Typically massive OPC is used to provide the densest possible wiring.

The present invention uses a coarse layout grid size with increased spacing between individual structures on each mask layer to avoid problems with electrical opens and shorts.

Figure 1:
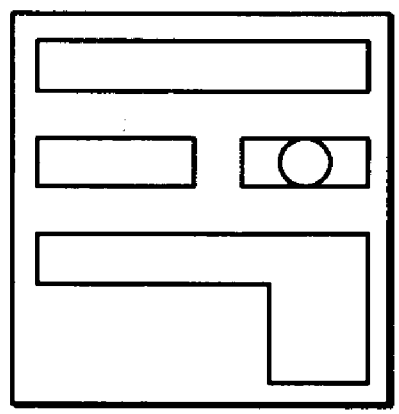
FIG. 1 illustrates a simplified example of a mask for an original wire and via layout before OPC.
Figure 2:
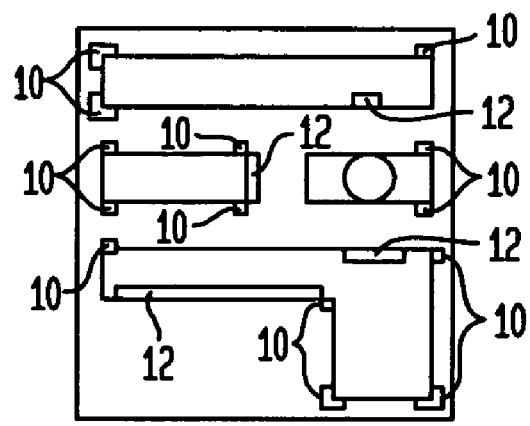
FIG. 2 illustrates the wire and via layout of FIG. 1 after OPC, as is generally known in the art, in which some areas are added and other areas are removed.

FIGS. 1 and 2 illustrate a simplified example of a mask before and after OPC processing. FIG. 1 illustrates a simplified example of a mask for an original wire and via layout before OPC. FIG. 2 illustrates the wire and via layout of FIG. 1 after OPC in which the areas 10 are added, and the areas 12 are removed. The OPC improves the lithographic printing of the wires, thus decreasing via to wire opens and wire to via shorts Typically in OPC, as illustrated by FIGS. 1 and 2, shapes are either added to or removed from structures on a mask, with the shapes being defined by an integral number of grid points. For example, a line end extension might be added, ranging from 1 to 10 grid points (5 nm to 50 nm), depending upon how much space there is to an adjacent line.

In addition, mask comps are commonly employed to slightly increase or decrease the width of mask shapes (typically <5 grid points). This conversion of simple shapes to more complicated shapes significantly increases the data volume and complexity, with resulting increased data preparation cost, increased mask build cost, and increased risk of making an error which results in a higher defect density on the wafer. The benefit of the conversion is that wire width and spacing requirements can be increased without increasing the chip size.

The present invention provides a set of migratable design rules that allow the use of a layout grid size equal to the minimum ground rule for a given technology. For simplicity, the explanation focuses on wiring masks and via masks, although the subject invention is applicable to all mask levels.

More specifically, the present invention provides a methodology for simplifying a circuit layout with layout rules that provide a layout grid size customized for each level based upon the pitch and minimum ground rules for that level.

In a broad aspect, the present invention:

1. develops a set of layout rules that selects a layout grid size for a given level based upon the pitch and minimum ground rules for that level.

2. applies the layout rules developed in step 1 to customize the layout grid size (for at least one and normally more levels).

In a more detailed aspect, the present invention:

1. identifies the minimum line width/space (as defined for example by ½ the minimum pitch).

2. selects a layout grid size having a value that, a) is greater than a minimum required offset for manufacturing features (such as vias), and also b) is a factor of the minimum line width/space, generally between the minimum line width/space and ¼ the line width space (¼, ⅓, ½, or 1×)

3. lays out all wires using the selected grid size for developing a new circuit layout, or for modifying an existing circuit layout.

4. provides a minimum line width/space, with one (1) additional grid point spacing being provided around manufacturing features (such as wires under or over vias).

5. performs an optional data prep, which generally examines the overall mask design and equalizes the pattern factor, which is a ratio of print to non-print across the chip, by adding dummy shapes to the mask, as is generally known in the art.

In cases where OPC is needed, start with steps 1–5 above, and add an additional second pass adjustment of the layout and the data prep with approximately ¹/₁₀ the line width/space grid to allow for rudimentary OPC.

The following is a discussion of several specific embodiments.

The contacted polysilicon (PC) level pitch defines the ground rules needed for wiring masks and via masks. For a 65 nm generation CMOS technology, the contacted PC level pitch is 160 nm (i.e. 80 nm line/space). Typically, for a CMOS BEOL (back end of line processing) with multilevel wiring, the wiring width/space/pitch are given in the following table.

In the following table, 1X via is the via layer that connects 1X wire (metal M) to 2X wire, 2X via is the via layer that connects 2X wire to 4X wire, and 4X via is the via layer that connects 4X wire to 6X wire, etc.

| Level | minimum width/minimum space |
|---|---|
| M1 metal | 80 nm |
| 1× wire = 1× via | 100 nm |
| 2× wire = 2× via | 200 nm |

-continued

| Level | minimum width/minimum space |
|---|---|
| 4× wire = 4× via | 400 nm |
| 6× wire = 6× via | 600 nm |

Two options are presented, a first option of using 100 nm spacing and a second option of using 200 nm spacing.

One simple algorithm available to design a circuit layout and mask can use the ground rule width/space as the wiring layout and mask fabrication layout grid size (e.g. 80 nm for M1, 100 nm for 1X wires, etc.).

A potential problem with this approach is that OPC would not be possible. A solution to that problem is to relax the wiring width/space rules such that the wire and via width remain unchanged.

The following is a specific example of how all mask levels in a 65 nm generation CMOS design can be specified. It should be realized that there are an unlimited number of possible masks in different technologies by different manufacturers, and the following is a very specific example of a typical CMOS technology.

for very critical masks such as RX, PC and M1, use a traditional 5 nm grid size, but allow the layout to fit with a relaxed grid size for other mask levels by constraining interfaces between RX, PC, MI and front end of line processing (FEOL) block masks or CA/M1 back end of line processing (BEOL) masks, for FEOL block masks, use a 100 nm grid size, for BEOL CA mask, use a 25 nm grid size, for BEOL 1X wire masks (M2+), use a design grid size of 100 nm and a data prep grid size of 10 nm, for BEOL 1X via masks (VI+), use a design grid size of 100 nm, for BEOL 2X via and wire masks, use a design grid size of 200 nm, for BEOL 4X via and wire masks, use a design grid of 400 nm, for BEOL 6X via and wire masks, use a design grid of 600 nm.

Generically, considering the unlimited number of possible masks in different technologies by different manufacturers, the present invention classifies each mask according to four general parameters, minimum line size, minimum space size, minimum border for upper layers, and minimum borders for lower layers.

The following is a basic description of the present invention as used to develop a new circuit layout or to modify an existing circuit layout:

1) Define an integrated circuit containing N mask levels, where N>>1 (e.g. 50 for a 10 metal level chip).

2) Divide the masks into different groups, based on whether they are (a) used to provide connection between vertically adjacent levels (contact layers); or (b) used for horizontal patterning (wire layers); or (c) used to pattern alignment aids. Examples:

(a) vertical connection masks: vias between wiring levels; contacts to active or passive devices; MOSFET gates/source/drain; NPN emitter/gate/collector; passive resistors; passive capacitors; etc.

(b) horizontal patterning masks: gate conductors in MOSFET transistors; base or emitter conductors in NPN transistors; ion implant patterning mask; wire level mask; shallow trench isolation; etc.

(c) alignment aids: mask used to pattern and etch alignment aids for metal-insulator-metal (MIM) capacitors in the optical kerf, etc.

3) Define the critical dimension for each mask as the minimum resist line or space that must be printed using each mask. Determine the minimum critical dimension for each mask, and identify the overall mask set minimum critical dimension. Require that each mask be laid out using integer multiples of the minimum critical dimension.

4) Normalize the critical dimension for each mask by the overall mask set minimum critical dimension defined above in 3. This will result in each mask having a normalized critical dimensions >=1. For a CMOS technology with multiple levels of hierarchical wiring, this will result in normalized critical dimensions in the range of 1–10, where numbers larger than one are not required to be integers.

5) For all of the masks defined above, use a grid size equal to the critical dimension for each mask (if the masks are greater or less, use with lithography exposure tools which are greater or less than 1:1, adjust the grid size accordingly, as is known in the art).

option: the grid size could be equal to ½ (or ⅓, ¼, etc.) the minimum critical dimension for the mask and the layout rules described above would allow for horizontal features which are 1.5, 1.33, 1.25, etc. (or 0.7, 0.67, 0.75, etc.) times the minimum critical dimension for each mask.

6) The vertical connection masks, defined in 2a above, are used to fabricate vias or contacts between vertically adjacent levels on the wafer. To reduce or eliminate the possibility of either small contact area or opens (the via or contact partially contacting or missing the horizontal structure above or below), or unintended shorts between the contacts or vias and adjacent horizontal patterning features require:

option a) that the layout used for the horizontal patterning mask features contain borders above and below the contacts or vias which are equal to one grid point per edge as defined in 5 above and the via is greater or equal to 1 grid point away from all edges (i.e. the horizontal patterning feature which is coincident with a contact or via is bordered by one grid point on all sides of the via or contact). No data preparation or optical proximity correction would be employed prior to mask fabrication.

option b) that the minimum horizontal patterning mask feature width, for features that coincide with a contact or via above or below, be 2 grid points wider than the contact or via; and that the contact or via be centered in the horizontal patterning feature (i.e. the horizontal patterning feature which is coincident with a contact or via is bordered by one grid point on all sides of the via or contact). No data prep or optical proximity correction would be employed prior to mask fabrication.

option c) that the minimum horizontal patterning mask feature width be 2 grid points wider than the minimum critical dimension and that the contact or via be located such that it always is bordered by 1 or more grid points.

option d) that the minimum horizontal patterning mask space width between features be 2 grid points wider than the minimum critical dimension.

option e) that all features on the horizontal patterning mask have spaces between them greater or equal the minimum critical dimension defined in 3 above, plus 2 grid points; and that all contacts or vias be centered in the horizontal patterning feature. Prior to mask fabrication optical proximity correction would be employed. The OPC would consist of bordering each contact or via by one grid point on all sides, with the grid point defined in 5 above.

The present invention provides a method for developing or modifying a layout for fabricating a very large scale integrated circuit in a plurality of different layers having a plurality of masks for the different layers, in a given IC technology with a set of reduced ground rules for layout grids for the plurality of different layers. Following step 2) above wherein the plurality of masks are classified into different groups, depending upon which group a mask is classified into, use the design rules for the given IC technology to establish a layer-specific layout grid increment value for that mask, to develop a plurality of layer-specific layout grid increment values for the plurality of masks. Then use a layout-optimization application to scale data and select the size of the layout grid increment value for at least some of the plurality of different layers of the VLSI layout while also enforcing other constraints such as area growth or electrical properties. Then use a layout-optimization application to select minimum line widths and minimum line spaces for at least some of the plurality of different layers of the VLSI layout. Then use a shape-processing application to select via sizes, via locations, and via borders for at least some of the plurality of different layers of the VLSI layout.

In implementing the present invention, the layout database might be split across different files with different representations of minimum feature size.

Pursuant to the present invention, the grid size at any mask level of a multilevel IC should be an integer divisor of a larger grid size at another mask level. Moreover, at each mask level, the minimum line width and the minimum line space are preferably the same. If they are not the same, then the grid size should be an integer divisor into both the minimum line width and the minimum line space. For example, for a 200 nm minimum pitch level, the minimum line width and the minimum line space could be 100 nm. Alternatively, the minimum line width could be 125 nm and the minimum line space could be 75 nm, with a grid size of 25 nm which is an integer divisor into both 125 nm and 75 nm.

Figure 3:
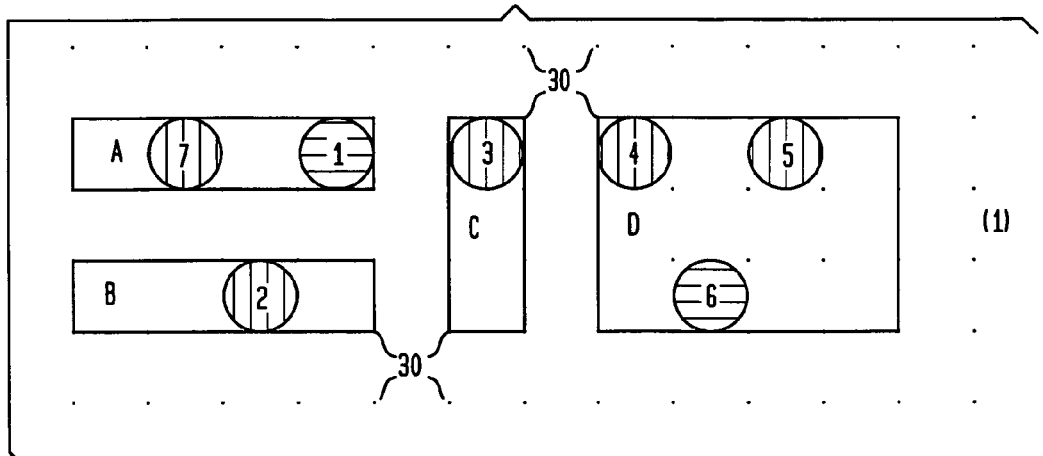
FIG. 3 shows an illustrative starting first embodiment of the present invention for a 65 nm generation mask having different wire features A–D, with connecting vias 1–7.

The following Table 1 refers to and describes embodiments 1–5 shown respectively in FIGS. 3–7, wherein embodiment 1 shown in FIG. 3 is a starting point for embodiments 2–5 shown in FIGS. 4–7.

| Embodiment | Border Surrounding via | Via to adjacent wire in a different network, min. space | Wire to adjacent wire min. space | Narrow wire end comp | Grid size |
|---|---|---|---|---|---|
| 1 (FIG. 3) | 0 nm | 100 nm | 100 nm | 0 | 100 nm |
| 2 (FIG. 4) | 25 nm | 125 nm | 100 nm | 0 | 25 nm |
| 3 (FIG. 5) | 0 nm | 125 nm | 100 nm | 0 | 25 nm |
| 4 (FIG. 6) | 25 nm | 75 nm | 50 nm | 0 | 25 nm |
| 5 (FIG. 7) | 0 nm | 75 nm | 75 nm | 25 nm | 25 nm |

FIG. 3 shows an illustrative starting first embodiment of the present invention for a 65 nm generation mask having different wire features A, B, C and D, with connecting vias 1, 2, 3, 4, 5, 6 and 7. Note the very large grid size of 100 nm represented by the spaced array of grid points 30. The vias 1–7 are 100 nm diameter and have 0 nm borders, and the wire to wire minimum space is 100 nm.

Figure 4:
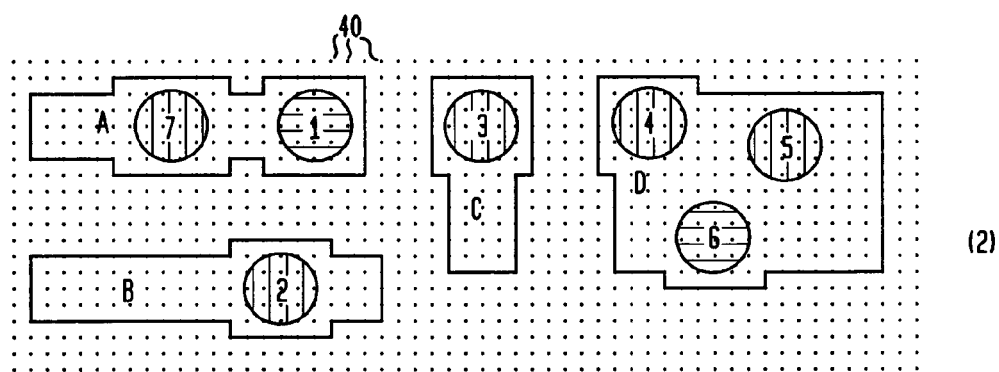
FIG. 4 illustrates a modified second embodiment (modified relative to the first embodiment) having the same general wire features A–D and same general connecting vias 1–7 and a much smaller grid size.

FIG. 4 illustrates a modified second embodiment (modified relative to embodiment 1) having the same general wire features A–D and same general connecting vias 1–7. Note the relatively smaller grid size of 25 nm represented by the spaced array of grid points 40. The vias 1–7 are 100 nm diameter and have 25 nm borders, and the wire to wire minimum space is 100 nm.

Figure 5:
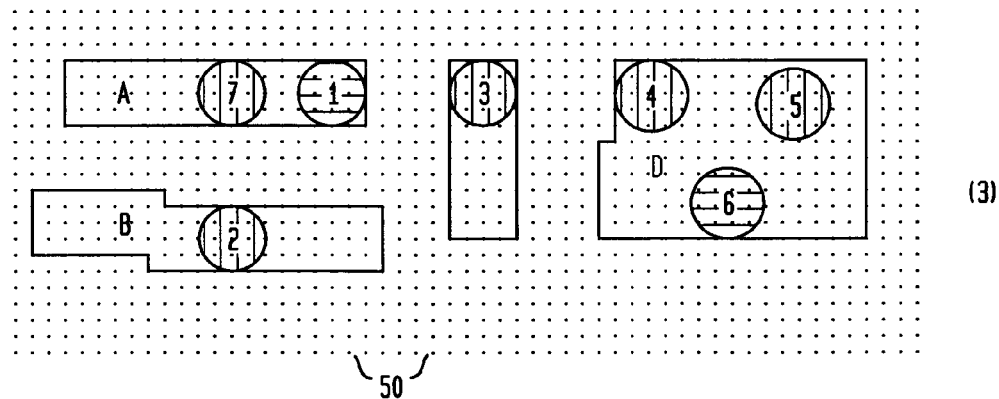
FIG. 5 illustrates a modified third embodiment having the same general wire features A–D and same general connecting vias 1–7.

FIG. 5 illustrates a modified third embodiment having the same general wire features A–D and same general connecting vias 1–7. Note the small grid size of 25 nm represented by the spaced array of grid points 50. The vias 1–7 are 100 nm diameter and have 0 nm borders, and the wire to wire minimum space is 100 nm.

Figure 6:
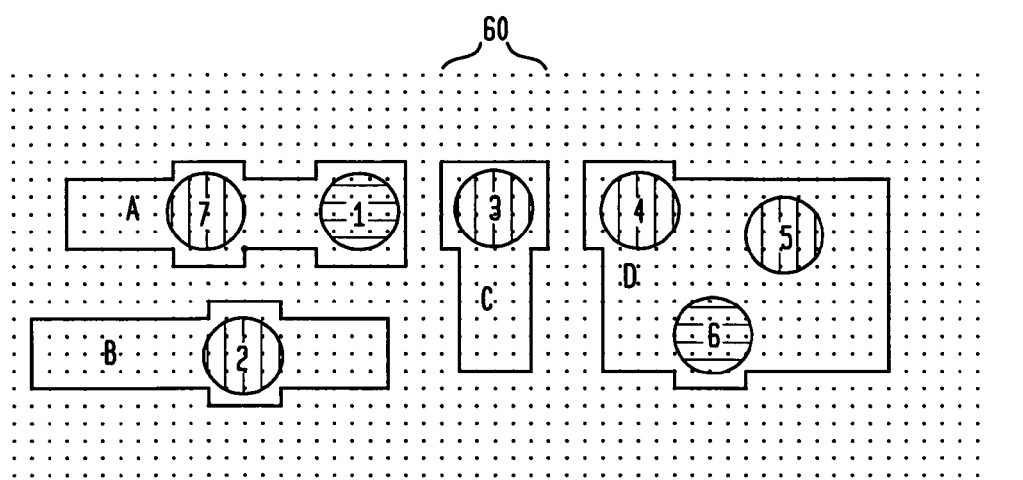
FIG. 6 illustrates a modified fourth embodiment having the same general wire features A–D and same general connecting vias 1–7.

FIG. 6 illustrates a modified fourth embodiment having the same general wire features A–D and same general connecting vias 1–7. Note the small grid size of 25 nm represented by the spaced array of grid points 60. The vias 1–7 are 100 nm diameter and have 25 nm borders, and the wire to wire minimum space is 50 nm.

Figure 7:
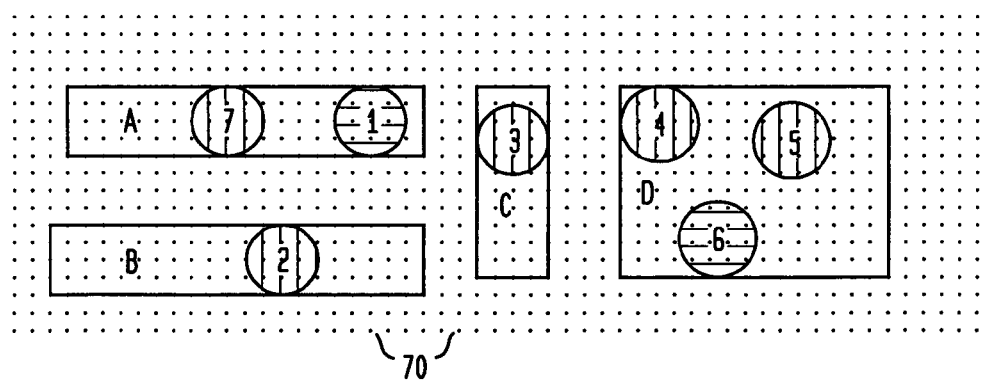
FIG. 7 illustrates a modified fifth embodiment having the same general wire features A–D and same general connecting vias 1–7.

FIG. 7 illustrates a modified fifth embodiment having the same general wire features A–D and same general connecting vias 1–7. Note the small grid size of 25 nm represented by the array of grid points 70. The vias 1–7 are 100 nm diameter and have 0 nm borders, and the wire minimum space is 75 nm.

| Mask Type | Mask Level | Minimum Nominal Feature Size | Grid Size emb. 1 | Grid Size emb. 2 |
|---|---|---|---|---|
| 1 | RX DT PC | 40 nm | 20 nm | 5 nm |
| 2 | Blocks, OP | 100 nm | 100 nm | 25 nm |
| 3 | C1 M1 | 80 nm | 20 nm | 20 nm |
| 4 | 1x-Via 1x-Wire | 100 nm | 100 nm | 25 nm |
| 5 | 2x-Via 2x-Wire | 200 nm | 200 nm | 50 nm |
| 6 | 4x-Via 4x-Wire | 400 nm | 400 nm | 100 nm |
| 7 | Passive MIM bot. plate Passive MIM top plate Passive thin film resistor | 2 μm | 2 μm | 1 μm |

Mask type 1 encompasses RX=the shallow trench isolation, DT=one or more masks used for fabricating deep trench capacitors, and PC=the polysilicon or silicon used for the MOSFET gate, NPN emitter, etc.

Mask type 2 encompasses Blocks=the ion implantations used for silicon or polysilicon doping, and OP=silicon without silicide (e.g. resistor, bipolar junction transistor, etc.)

Mask type 3 encompasses C1=the contact between PC and M1, and M1=the first wire level.

Mask type 4 encompasses 1X-Wire=the next and subsequent wiring levels with 100 nm minimum feature size, and 1X-Via=vias to connect adjacent wiring levels.

Mask type 5 encompasses 2X-Wire, 2X-Via.

Mask type 6 encompasses 4X-Wire, 4X-Via, etc. define relaxed pitch wire and via levels.

Mask type 7 encompasses passive components with a relatively large feature size such as passive capacitors, resistors, etc.

While several embodiments and variations of the present invention for a circuit layout methodology are described in detail herein, it should be apparent that the disclosures and teachings of the present invention will suggest many alternative designs to those skilled in the art.

What is claimed is:

1. A method for developing or modifying a layout for fabricating a very large scale integrated circuit (IC) (VLSI), in a plurality of different layers having a plurality of masks for the different layers, in a given IC technology with a set of reduced ground rules for layout grids for the plurality of different layers, wherein the size of an increment in a layout grid represents the smallest dimension that can be used by a designer in layout data, comprising:

classifying the plurality of masks into different groups based upon whether they are (a) used to provide vertical connections between vertically adjacent layers, or (b) used for horizontal patterning, or (c) used to pattern alignment aids;

depending upon which group a mask is classified into, using design rules for the given IC technology to establish a layer-specific layout grid increment value for that mask, to develop a plurality of layer-specific layout grid increment values for the plurality of masks;

using a layout-optimization application to scale data and select the size of the layout grid increment value for at least some of the plurality of different layers of the VLSI layout;

using a layout-optimization application to select minimum line widths and minimum line spaces for at least some of the plurality of different layers of the VLSI layout;

using a shape-processing application to select via sizes, via locations, and via borders for at least some of the plurality of different layers of the VLSI layout.

2. The method of claim 1, further including for at least some of the masks, defining a minimum critical dimension as a minimum resist line width or line space that is printed using that mask, and using a layout grid having a grid increment value equal to the minimum critical dimension for that mask.

3. The method of claim 2, further including for a set of masks, identifying an overall set of masks minimum critical dimension, and requiring that each mask be laid out using integer multiples of the overall set of masks minimum critical dimension.

4. The method of claim 3, further including normalizing the minimum critical dimension for each mask by the overall set of masks minimum critical dimension.

5. The method of claim 1, further including for a given layer, selecting a layout grid increment value based upon pitch, which is the spacing between repetitive identical features of the given layer, and defining a minimum line width and line space as a fraction of the pitch.

6. The method of claim 1, further including for a given layer, selecting a layout grid increment value between an integer fraction of the minimum line width and line space, and the minimum line width and line space.

7. The method of claim 1, further including for a given layer, providing at least one additional layout grid increment spacing around manufacturing features.

8. The method of claim 1, including for at least some of the masks, defining a minimum critical dimension according to minimum line size, minimum space size, minimum border for upper layers, and minimum borders for lower layers.

9. The method of claim 1, including for at least some of the masks, selecting the layout grid increment value to be a fraction of the minimum critical dimension for that mask, and designing horizontal features to be an integer or fraction of the minimum critical dimension.

10. The method of claim 1, further including for each group (a) vertical connection mask, requiring horizontal patterning mask features to include borders above and below contacts or vias that are equal to at least one layout grid increment for all edges.

11. The method of claim 1, further including for each group (a) vertical connection mask, requiring that each via is greater than or equal to one grid increment away from all edges.

12. The method of claim 1, further including for each group (a) vertical connection mask, employing data preparation or optical proximity correction only after mask fabrication.

13. The method of claim 1, further including for each group (a) vertical connection mask, requiring that the minimum horizontal patterning mask feature width, for features that coincide with a contact or via above or below, be at least two grid increments wider than the contact or via, and that the contact or via be centered in a horizontal patterning feature.

14. The method of claim 1, further including for each group (a) vertical connection mask, requiring that the minimum horizontal patterning mask feature width be at least two grid increments wider than the minimum critical dimension, and that each contact or via be bordered by one or more grid increments.

15. The method of claim 1, further including for each group (a) vertical connection mask, requiring that the minimum horizontal patterning mask space width between features be at least two grid increments wider than the minimum critical dimension.

16. The method of claim 1, further including for each group (a) vertical connection mask, employing optical proximity correction prior to mask fabrication including bordering each contact or via by at least one grid increment on all sides.

* * * * *